US009123502B2

(12) United States Patent
Ward

(10) Patent No.: US 9,123,502 B2
(45) Date of Patent: Sep. 1, 2015

(54) SCAN METHOD

(75) Inventor: Billy W. Ward, Boyce, LA (US)

(73) Assignee: Carl Zeiss Microscopy, LLC, Thornwood, NY (US)

(*) Notice: Subject to any disclaimer, the term of this patent is extended or adjusted under 35 U.S.C. 154(b) by 997 days.

(21) Appl. No.: 13/237,426

(22) Filed: Sep. 20, 2011

(65) Prior Publication Data

US 2012/0057015 A1 Mar. 8, 2012

Related U.S. Application Data

(63) Continuation of application No. PCT/EP2010/033466, filed on May 4, 2010.

(60) Provisional application No. 61/179,895, filed on May 20, 2009.

(51) Int. Cl.
*H04N 7/18* (2006.01)
*H01J 37/26* (2006.01)
*H01J 37/28* (2006.01)

(52) U.S. Cl.
CPC ............... *H01J 37/265* (2013.01); *H01J 37/28* (2013.01); *H01J 2237/22* (2013.01)

(58) Field of Classification Search
None
See application file for complete search history.

(56) References Cited

U.S. PATENT DOCUMENTS

| 5,532,494 | A | 7/1996 | Kawanami et al. |
| 6,453,063 | B1 | 9/2002 | Phaneuf et al. |
| 7,034,296 | B2 | 4/2006 | Sato et al. |
| 2001/0022346 | A1 | 9/2001 | Katagami et al. |
| 2003/0111602 | A1 | 6/2003 | Sato et al. |
| 2004/0108459 | A1 | 6/2004 | Furukawa et al. |

FOREIGN PATENT DOCUMENTS

| JP | S 64-43959 | 2/1989 |
| JP | H 01-109650 | 4/1989 |
| JP | H 07-29536 | 1/1995 |
| JP | 2001-250500 | 9/2001 |
| JP | 2005-216645 | 8/2005 |

OTHER PUBLICATIONS

Japanese Office Action, with translation thereof, for corresponding JP Appl No. 2012-511874, dated Jan. 7, 2014.
The International Search Report and Written Opinion for the corresponding PCT Application No. PCT/US2010/033466, mailed Jul. 2, 2010.
Kaynig et al., "Probabilistic image registration and anomaly detection by nonlinear warping," Computer Vision and Pattern Recognition, 2008, Piscataway, NJ, Jun. 23, 2008, pp. 1-8.
Chinese Office Action, with translation thereof, for corresponding CN Appl No. 201080022141.3, dated Mar. 5, 2014.
Chinese Office Action, with translation thereof, for corresponding CN Appl No. 201080022141.3, dated Oct. 17, 2014.

*Primary Examiner* — Sath V Perungavoor
*Assistant Examiner* — Kate Luo
(74) *Attorney, Agent, or Firm* — Fish & Richardson P.C.

(57) ABSTRACT

In general, in one aspect, the disclosure features a method and system for imaging of samples, for example, imaging samples with charged particles.

23 Claims, 14 Drawing Sheets

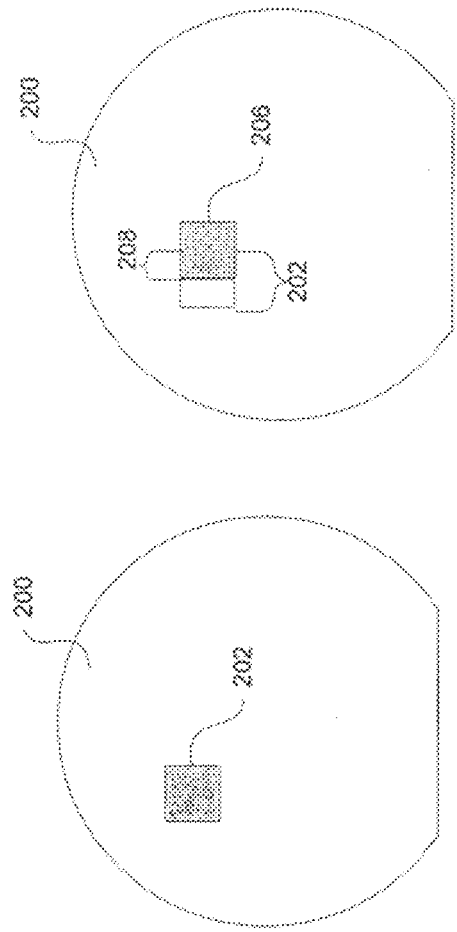
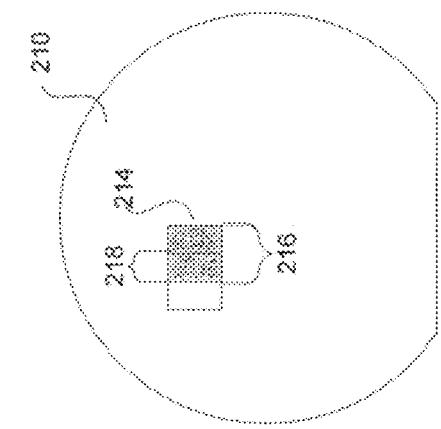
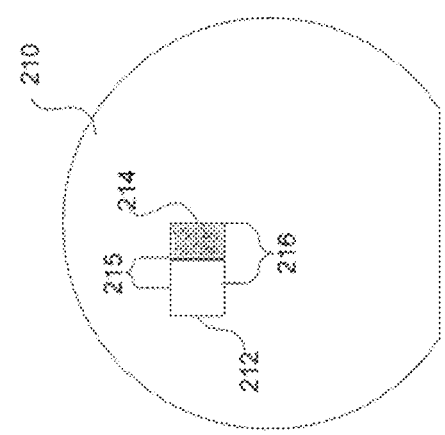
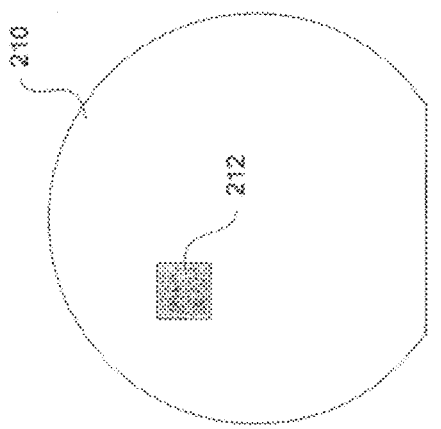

SCAN METHOD

CROSS-REFERENCE TO RELATED APPLICATIONS

This application is a continuation of, and claims benefit under 35 USC 120 to, international application PCT/US2010/033466, filed May 4, 2010, which claims benefit under 35 USC 119(e) to U.S. Ser. No. 61/179,895, filed May 20, 2009. The entire contents of both of these applications are incorporated herein by reference.

TECHNICAL FIELD

This disclosure relates to scanning methods for imaging of samples, for example, imaging samples with charged particles.

BACKGROUND

Samples can be exposed to charged particles for a variety of applications, including sample imaging. In some embodiments, imaging of the sample includes raster scanning of a field of view to obtain an image of the portion of the sample included in the field of view. When a user desires to view a different portion of the sample, the system modifies the field of view and performs a raster scan of the new region included in the new field of view.

SUMMARY

Methods for scanning a sample and obtaining an image of a surface of the sample are disclosed. The methods involve obtaining and joining slow scan images of the sample and presenting the images to the user. In some embodiments, the user can pan and zoom the stored image to view different portions of the sample (e.g., in contrast to moving the stage and obtaining a new image of a region of interest). As the user pans and zooms within the stored image, the stored image moves on the user interface as if the stage and the sample were moving.

In some aspects, the system predicatively obtains and stores images of regions of the sample which are outside of the region images in an image currently being viewed by the user. The system can subsequently retrieve and present these obtained images to the user if the user desires to view the portion of the sample for which the images were obtained. To present the newly acquired images to the user, the system joins the newly acquired images with the previous image(s).

In some aspects, methods and systems for scanning a sample can include recognizing a user's intent to move a previously stored image (e.g., based on user input) and scanning, via a slow scan, a portion (e.g., a strip) of the sample adjacent to the edge of the stored image in the recognized direction. The newly acquired image is joined with the previously acquired image.

In some aspects, a method includes exposing a first portion of a sample to a charged particle beam to generate a first image of the first portion of the sample and receiving, at a control system, a directional input. The method also includes determining if a second portion of the sample adjacent to the first portion of the sample in a direction based on the directional input has been previously exposed to generate an image of the second portion. The method also includes, if the second portion has been previously exposed, retrieving the image of the second portion from a memory and, if the portion has not been previously exposed, exposing a second portion of the sample adjacent to the first portion of the sample in a direction based on the directional input to a charged particle beam to generate a second image. The method also includes combining at least a portion of the first image with the second image or the retrieved image of the second portion to generate a third image and displaying the third image on a user interface.

Embodiments can include one or more of the following.

Exposing the first portion of the sample to the charged particle beam to generate the first image can include using a slow scan technique and exposing the second portion of the sample to the charged particle beam to generate the second image can include using a slow scan technique. The he second image can include a fewer number of pixels than the first image. The second portion of the sample can include a smaller area of the sample than the first portion of the sample. The directional input can include an indication of a direction of movement and an indication of a speed of movement.

The method can also include determining a size of the second portion of the sample to expose to the particle beam based on the indication of the speed of movement and determining a location of the second portion of the sample to expose to the particle beam based on the direction of movement. Combining at least a portion of the first and second images to generate the third image can include combining a subsection of less than the entire first image with at least a portion of the second image. Receiving the directional input can include displaying the first image on a user interface and moving, in response to a user input, the first image on the user interface. Moving the first image on the user interface can include moving the first image without moving the sample. Exposing a second portion of the sample adjacent to the first portion of the sample in a direction based on the directional input can include exposing the second portion to generate a low resolution image and subsequently exposing the second portion to generate a high resolution image.

The method can also include, if the second portion has been previously exposed, determining a resolution of the retrieved image of the second portion. Combining at least a portion of the first image with the retrieved image of the second portion to generate the third image can include agglomerating image data from the retrieved image of the second portion to match a resolution of the first image. Combining at least a portion of the first image with the retrieved image of the second portion to generate the third image can include interpolating image date from the retrieved image of the second portion to match a resolution of the first image.

In some aspects, a method includes exposing a sample to a charged particle beam to generate a first image of a first portion of the sample and exposing portions of the sample adjacent to the first portion of the sample in multiple directions to a charged particle beam to generate a set of adjacent images. The method also includes receiving, at a control system, a directional input, combining at least a portion of the first image with at least a portion of one or more of the adjacent images to generate a third image, and displaying the third image on a user interface.

In some aspects, a method includes displaying, on a user interface associated with an ion microscope, a first image of a first portion of a sample, the first image comprising an image generated by exposing the first portion of the sample to a charged particle beam. The method also includes displaying, on the user interface, a second image of a second portion of the sample, the second portion of the sample including a non-overlapping region not included in the first portion and an overlapping region included in the first portion; the second image comprising an image generated by exposing the non-overlapping region of the sample to a charged particle beam without exposing the overlapping region to the charged particle beam.

In some aspects, a method includes displaying a slow scan image of a first portion of a sample at a first magnification on a user interface, receiving an input from a user, the input indicating a second portion of the sample desired to be viewed at a second level of magnification that is different than the first level of magnification, and determining if the second portion has been previously exposed to generate an image of the second portion at the second level of magnification. The method also includes if the second portion has been previously exposed at the second level of magnification, retrieving the image of the second portion from a memory, and if the second portion has not been previously exposed at the second level of magnification, scanning the second portion of the sample at the second magnification using a slow scan technique, displaying the slow scan image of the second portion of the sample on the user interface. In some embodiments, the second portion can be a subsection of the first portion and the second magnification is a higher level of magnification than the first level of magnification.

In some aspects, a method includes exposing a first portion of a sample to a charged particle beam to generate a first image of a the first portion of the sample at a first level of magnification; receiving, from a user, an identification of one or more regions of interest in the first image and exposing the identified regions of interest to the charged particle beam to generate a images of the regions of interest at a second level of magnification, the second level of magnification being greater than the first level of magnification.

The details of one or more embodiments are set forth in the accompanying drawings and the description below. Other features and advantages will be apparent from the description, drawings, and claims.

DESCRIPTION OF DRAWINGS

FIGS. 2A and 2B are diagrams of a prior art scanning process.
FIGS. 3A, 3B, and 3C are diagrams of a scanning process.

Like reference symbols in the various drawings indicate like elements.

DETAILED DESCRIPTION

Figure 1:
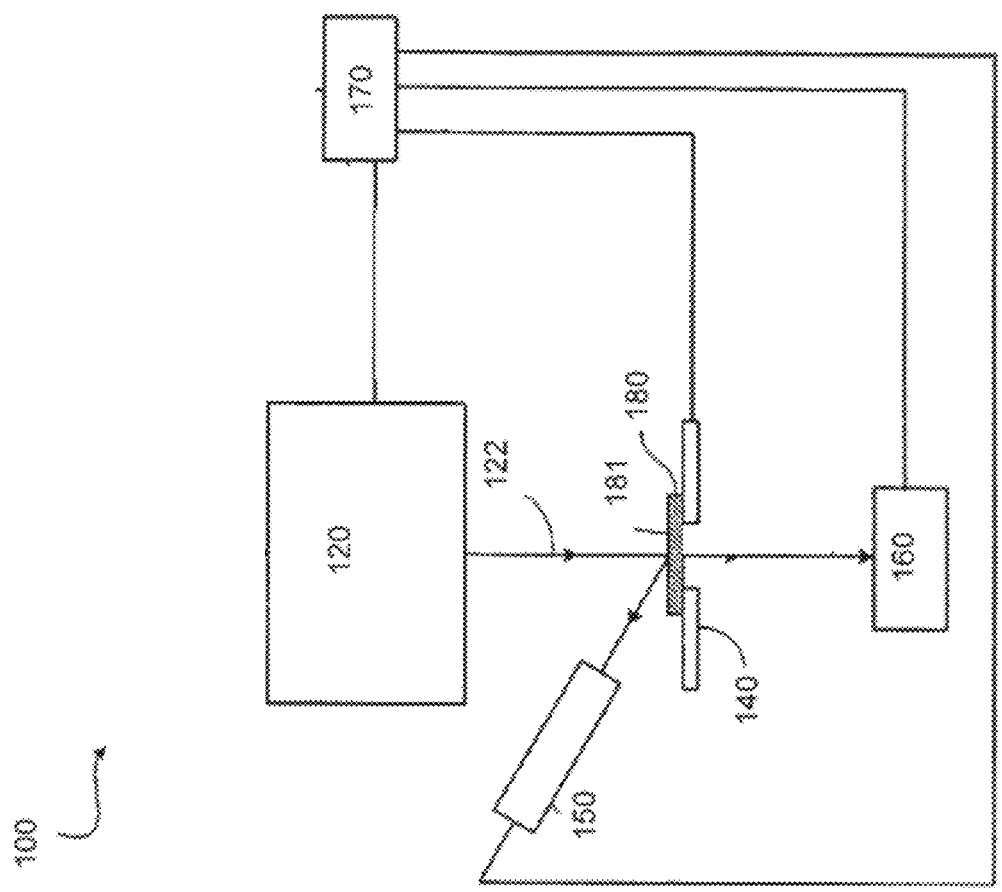
FIG. 1 is a diagram of a microscope system.

Referring to FIG. 1, a microscope system 100 for obtaining one or more images of a sample 180 is shown. The microscope system 100 produces ion beams and detects particles that leave the sample 180 due to exposure of the sample 180 to the ion beam to obtain the one or more images of the sample 180. Various scanning procedures can be used to obtain the images(s) of the sample 180. Prior to describing such scanning procedures, an overview of some of the components of the system 100 will be discussed.

FIG. 1 shows a schematic diagram of a gas field ion microscope system 100 that includes an ion beam generator 120, a sample manipulator 140, a front-side detector 150, a back-side detector 160, and an electronic control system 170 (e.g., an electronic processor, such as a computer) electrically connected to various components of system 100 via communication lines. In general, a gas field ion microscope is a microscope that use a gas field ion source to generate ions that can be used in sample analysis (e.g., imaging). A sample 180 is positioned in/on sample manipulator 140 between ion beam generator 120 and detectors 150, 160. During use, an ion beam 122 is directed to a surface 181 of sample 180, and particles 194 resulting from the interaction of ion beam 122 with sample 180 are measured by detectors 150 and/or 160.

The operation of microscope system 100 is typically controlled via electronic control system 170. For example, electronic control system 170 can be configured to position sample manipulator 140 to generate an image of a particular region of interest of sample 180. Optionally, one or more parameters may be manually controlled (e.g., via a user interface integral with electronic control system 170). Typically, electronic control system 170 includes a user interface that features a display or other kind of output device, an input device, and a storage medium.

In general, the information measured by the detectors 150, 160 is used to determine information about sample 180. Typically, this information is determined by obtaining one or more images of sample 180. By rastering ion beam 122 across surface 181, pixel-by-pixel information about sample 180 can be obtained in discrete steps. In general, the fidelity of an image obtained by such a rastering ion beam 122 is correlated to the length of time that the portion of the surface associated with a particular pixel of the image is scanned. For example, if a pixel is scanned quickly, the number of particles resulting from the interaction of the ion beam 122 with sample 180 is limited thereby lowering the fidelity of the information obtained by the detectors for the pixel. As the length of time a portion of the surface associated with the pixel is scanned increases, the number of particles resulting from the interaction of ion beam 122 with sample 180 increases. Due to the increased number of particles, the fidelity of the pixel also increases. In some examples, it is believed that the fidelity of the information obtained for a particular pixel is correlated to the length of time that the pixel is imaged according a $\sqrt{N}$ relation, where N is the dwell-time for the pixel (e.g., the amount of time the pixel is scanned). For example, increasing a pixel dwell-time by a factor of 100 will increase the fidelity by a factor of ten (e.g., reduce the noise by a factor of ten).

Images of differing fidelity can be obtained by modifying the pixel dwell-time. Two exemplary types of images are 'fast scan' and 'slow scan' images. A 'fast scan' image provides a low fidelity image in a relatively short length of time. Exemplary lengths of time to obtain a fast scan image of a frame can be from about 1/100 second per frame to about 10 seconds per frame (e.g., from about 1/50 second per frame to about 5 seconds per frame, from about 1/25 second per frame to about 1 second per frame, from about 1/20 second per frame to about 1/5 second per frame, about 1/20 second per frame). As such, an advantage of a fast scan image is that the image can be provided rapidly. In contrast, a 'slow scan' image provides a higher fidelity image in comparison to the fast scan image, but the length of time required to obtain the slow scan image is increased in comparison to the length of time to obtain a similarly sized fast scan image. For example, the length of time required to obtain a slow scan image of a frame can be from about 30 seconds per frame to about 10 minutes per frame (e.g., from about 30 seconds per frame to about 7 minutes per frame, from about 1 minute per frame to about 5 minutes per frame, from about 1 minute per frame to about 3 minutes per frame, from about 30 seconds per frame to about 1 minute per frame, about 1 minute per frame). Slow scan images provide the advantage of higher fidelity in comparison to fast scan images due to the increased pixel dwell-times used to obtain the slow scan images Various scanning methods can be based on fast scanning and/or slow scanning techniques. In general, fast scans provide a lower quality (e.g., lower fidelity) image than a slow scan but provide the advantage of a relatively short acquisition time. In contrast, slow scans provide the advantage of producing higher quality (e.g., higher fidelity) images, but take more time to generate than a fast scan. As such, a tradeoff exists between the fidelity of an image and the amount of time required to generate the image.

FIGS. 2A and 2B show a prior art method of obtaining and displaying an image of a sample by mechanically moving the sample in a continuously rastered field (referred to herein as a continuous rastering method). The continuous rastering method uses fast scanning techniques to quickly update images presented to a user as the user moves the sample to view different portions of the sample. More particularly, in the continuous rastering method, the microscope system 100 rasters the ion beam 122 across the surface of sample 180 to obtain pixel-by-pixel information about sample 180. Upon viewing the fast scan image, the user can move the sample to view a different portion of the sample. When the user moves the sample, the microscope system 100 generates a new fast scan image of the new region by scanning the entire region.

For example, in FIG. 2A, the system performs raster-based scan of region 202 of sample 200 using a continuous rastering method. This fast scan image is displayed to the user. In FIG. 2B, the user has moved the sample to the left to view a region 206 of the sample to the right of region 202 which was previously imaged. Due to the user's movement of sample 200, the location of the region to be imaged is shifted but the size of the region remains the same (e.g., the same sized area of the sample will be scanned and displayed to the user). In order to generate an image of the new region 206, microscope system 100 performs a fast scan by rastering the ion beam across the surface to obtain pixel-by-pixel information about sample 200 in the new region 206. Since the new region of interest 206 overlaps the previous region 202, a portion 208 of the sample is re-scanned to generate the image of region 206.

Re-scanning portions of the sample which were previously scanned using fast scanning techniques can have various disadvantages. In some examples, since fast scanning techniques are used to obtain images of the sample as the user moves the sample, the resolution of the acquired images can be lower than desired by a user. The obtained images can be noisy (e.g., have a low fidelity) because in order to provide a rapid update of the image as the sample is moved, the method sacrifices picture fidelity as the system rapidly rescans the same areas (e.g., areas that overlap with adjacent areas and/or areas previously viewed by the user) with little or no noise filtration. If the user desires to view a higher fidelity image, the user sacrifices the image acquisition speed because the update time when viewing a new region of the sample increases because the entire new region is scanned at a slower acquisition speed. Such a reduced acquisition speed limits the user's ability to move the sample and view different portions of the sample in a timely manner.

In some additional examples, re-scanning of the same portions of the sample increases the ion exposure of the sample from the ion beam and can potentially damage the sample. For example, the continuous rastering technique can cause sample damage of various types as the operator searches, real-time, for the region of interest.

In some further examples, the continuous rastering method can require complex stage designs and control systems to provide smooth motion of the sample at all magnifications since the sample is moved to obtain the new images. Such complex stage designs can result in design restraints that sacrifice stiffness and alternative motion techniques.

FIGS. 3A-3C show a method of obtaining and displaying an image of a sample in which portions of the sample that have been previously scanned (e.g., previously displayed to the user) are not re-scanned as different portions of the sample are viewed by the user. As shown in FIG. 3A, a user can indicate a region 212 of a sample that 210 and the microscope system 100 performs a scan of the region 212 by rastering the ion beam across the surface to obtain pixel-by-pixel information in the identified region 212. In contrast to the methods described above in FIGS. 2A-2B, rather than performing a fast scan of region 212, system 100 performs a slow scan of region 212 resulting in a higher fidelity image. The user can zoom and pan the image of the sample to view portions of the image in greater detail. As the user moves the image of the sample, the sample itself is not moved and the previously images region is not re-scanned. As the user moves the image, the system acquires additional strips of images in regions adjacent to the image currently being viewed and manipulated by the user. These additional strips of images are added to the side(s) of the previously acquired image.

For example, in FIG. 3B, the user has moved the image of the sample to the left to view a region 216 of the sample to the right of region 212. Rather than scanning the entire region 216 (which would include re-scanning a portion 215 that is included in both region 212 and region 216), the microscope system 100 performs a slow scan of only a portion 214 of the new region 216 which was not previously imaged. Since only the portion 214 of the sample previously un-imaged is scanned, a slow scan can be used without greatly increasing the overall time to view the image of region 216 over the amount of time which would be required in the continuous rastering example described above to take a fast scan of the entire region 216. Once the new region 214 has been scanned, the system 100 joins the image of portion 214 with a sub-section 218 of the previously displayed image of region 212 to generate an image of the new region 216.

Since the image of region 216 overlaps the previous region 212 and the overlapping portion 218 is not re-scanned to generate the image of region 216, many of the disadvantages of the continuous rastering techniques described above can be reduced or eliminated. For example, A higher fidelity image can be displayed (due to the use of slow scan techniques) while still providing a rapid update of the image provided to the user because a smaller region is scanned as the user views different portions of the sample. The method can also reduce charging of the sample because, at a particular level of magnification, any area on the sample is scanned only a single time.

Figure 4:
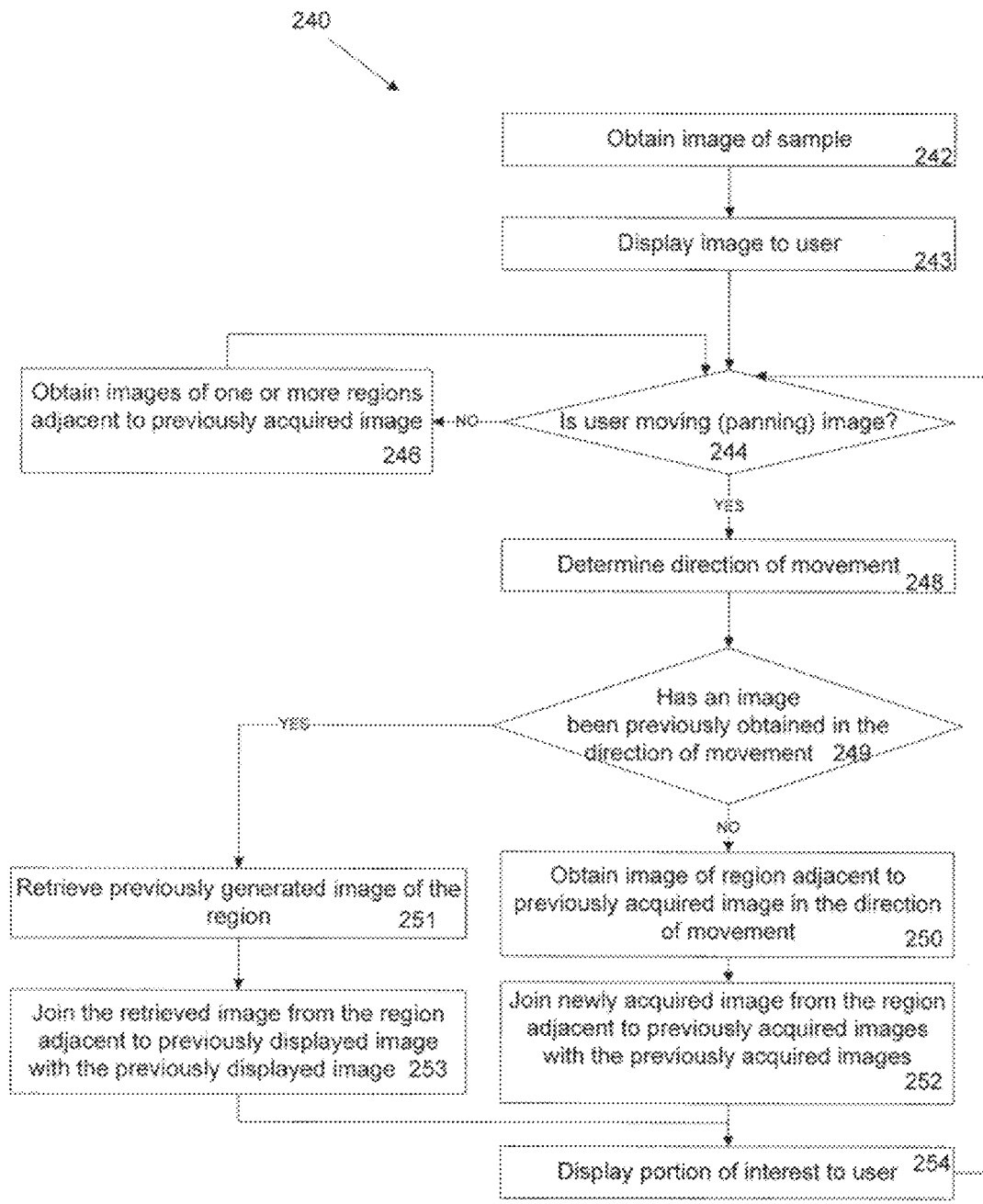
FIG. 4 is a flow chart of a process for obtaining images of a sample.

FIG. 4 shows a flow chart of an exemplary process 240 for obtaining an image of a sample without rescanning previously imaged portions of the sample. The system 100 obtains an image of a first portion of the sample (242). The image of the first portion of the sample is acquired using a slow scan technique in which an ion beam is rastered across the surface of the sample to obtain information about the sample. The length of time required to obtain the slow scan image of the portion of the sample can be from about 30 seconds per frame to about 10 minutes per frame (e.g., from about 30 seconds per frame to about 7 minutes per frame, from about 1 minute per frame to about 5 minutes per frame, from about 1 minute per frame to about 3 minutes per frame, from about 30 seconds per frame to about 1 minute per frame, about 1 minute per frame). Once the slow scan image has been obtained, the image is displayed to the user (243). For example, the image can be displayed on a user interface of a computer associated with the system. The user can zoom in and out on the image to view portions of the image at different levels of magnification. The user can also pan (e.g., move left, right, up and/or down) the image to view different portions of the acquired image. As the user pans and zooms, only the acquired image is moved on the user interface. The sample itself is not moved and the sample is not re-scanned as the portion viewed by the user changes. At any given level of magnification, each portion of the sample will be scanned only a single time. Since the originally acquired image includes information about a limited portion of the sample, often the user will desire to view regions of the sample that are not included in the original image. The system uses scanning algorithms to proactively scan additional portions of the sample based on the movements of the user and/or the lack thereof. By scanning a region of the sample prior to the user desiring to view the image of that portion of the sample, the system can quickly access the pre-acquired image from memory and display the image upon the user's request to view the image.

More particularly, the system determines if the user is panning the image (244). If the user is panning the image, the system determines the direction of movement of the image (248). Based on the determined direction of movement, the system determines if an image of adjacent to the previously acquired and displayed image has been previously obtained (249). If the image has not been previously obtained, the system obtains an image of a portion of the sample adjacent to the previously acquired image in the direction of movement (250).

The size of the region of the newly acquired image can differ from the size of the originally acquired image. By acquiring a smaller image, the system can obtain and display the image more quickly while still providing the fidelity of a slow scan image. For example, a ratio of the area of the first image to an area of the second image can be from about 20:1 to about 3:1 (e.g., from about 15:1 to about 5:1, 10:1 to about 5:1, 5:1 to about 3:1). Similarly, a ratio of the number of pixels in the first image to a number of pixels in the second image can be from about 20:1 to about 3:1 (e.g., from about 15:1 to about 5:1, 10:1 to about 5:1, 5:1 to about 3:1).

In some embodiments, the size of the region for which an image is obtained varies based on the speed of the user's movement. For example, if the user is quickly panning across the previously acquired image, a smaller image could be acquired so that the image could be available more quickly whereas if the user is slowly moving the previously acquired image, the system could acquire a larger image.

After acquiring the new image in a region adjacent to the previously acquired image, the system joins the newly acquired image with the previously acquired image(s) (252) and displays a region of interest to the user (254). The region of interest may include portions of the newly acquired image or may only include portions of the previously acquired image. While the newly acquired image may not be immediately displayed, scanning the regions adjacent to the current image based on the direction of movement provides the advantage of acquiring images of portions of the sample that the user is likely to desire viewing at a later point in time.

If, the system determines that an image of a region adjacent to the previously acquired and displayed image has been previously obtained (249), the system retrieves the previously generated image (251). In order to present an image to the user, the system joins the previously obtained image of the region adjacent to the previously acquired and displayed image in the direction of movement and the previously displayed image (253) and displays a region of interest to the user (254).

Figure 5A:
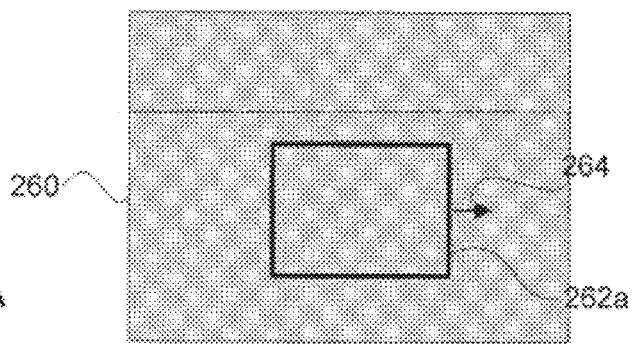
FIGS. 5A, 5B, 5C, and 5D are diagrams of an exemplary image acquisition process.
Figure 5B:
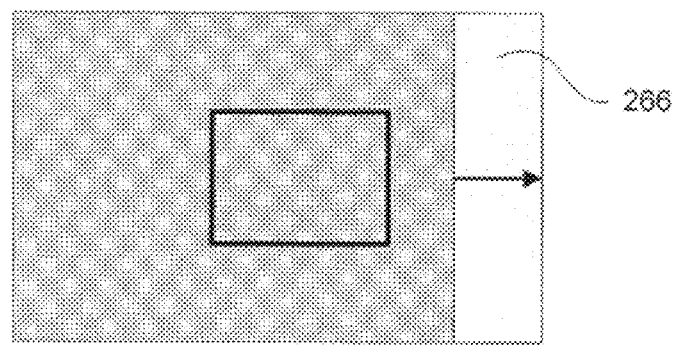
Figure 5C:
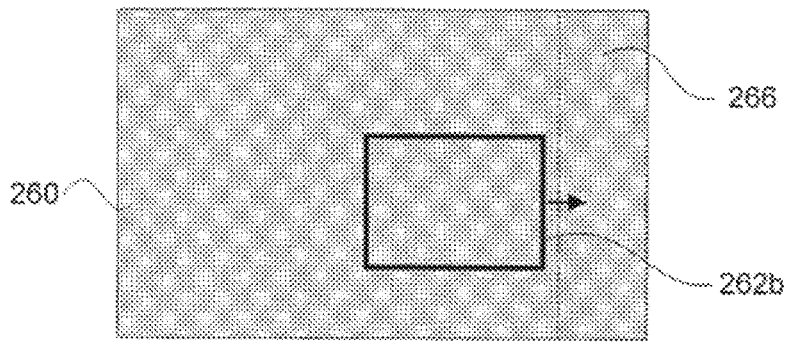
Figure 5D:
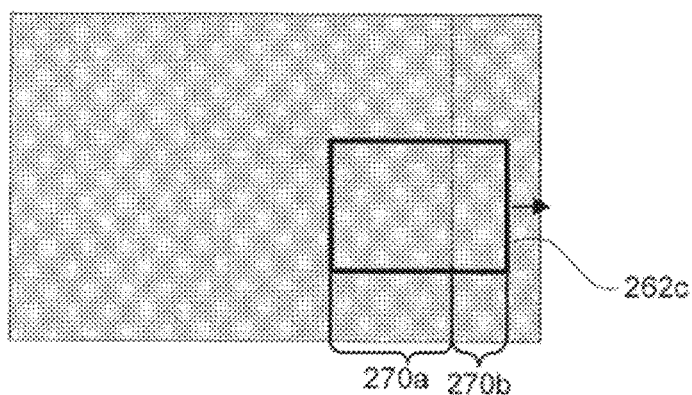

FIGS. 5A-5D show an example of acquiring and displaying images based on a user's direction of movement. As shown in FIG. 5A, the system generates a slow scan of a region 260. The user can zoom in and out to view different portions of the image of region 260. As shown in FIG. 5A, the user has zoomed into a region 262a and the portion of the image of region 260 in region 262a is displayed at a magnified size. The user can move the portion of the image of region 260 which is displayed. As the user moves the displayed portion, only the image moves and the system does not move the stage or sample. For example, the user can move the region of interest to the right (as indicated by arrow 264). As shown in FIG. 5B, the system does not re-scan the sample to display the new region of interest, but rather shifts the image of region 260 to display a different portion of the previously acquired image. Based on the determined direction of movement, the system scans a new region 266 of the sample located adjacent to region 260 in the direction of movement (as indicated by arrow 264). Once the system has completed the slow scan of region 266, an image of region 266 is aligned and joined with the previous image of region 260. If the user has only moved the image of region 260 a small distance to the right, the portion of the joined image that includes images of regions 260 and 266 displayed to the user may only include a portion 262b of the original image 260 (e.g., as shown in FIG. 5C). However, as shown in FIG. 5D, once the user has moved outside the region 260, the system displays an image 262c that includes a portion 270a of the original image of region 260 and a portion 270b of the newly obtained image of region 266. In order to display the region of interest 262c that includes a portion 270a of the first image and a portion 270b of the second image, the system does not rescan the entire region 262c. Rather, the system joins the two regions 270a and 270b from the separately acquired images of regions 260 and 266 and displays the joined image to the user.

Referring back to FIG. 4, in addition to obtaining images of various portions of a sample based on the direction of movement when the user is panning the image, the system can also acquire additional images of portions of the sample when the user is not panning the image. For example, if the system determines that the user if not panning the image (244), the system can collect one or more images in region(s) adjacent to the previously acquired image(s) (246). These image(s) can be stored in a memory of a computer and later retrieved if the user pans to the portion of the sample included in the acquired image. Acquiring the images in advance of the user navigating to the portion of the sample associated with the image can provide the advantage of having the images already available such that the image can be displayed more quickly when the user navigates to that region.

Figure 6A:
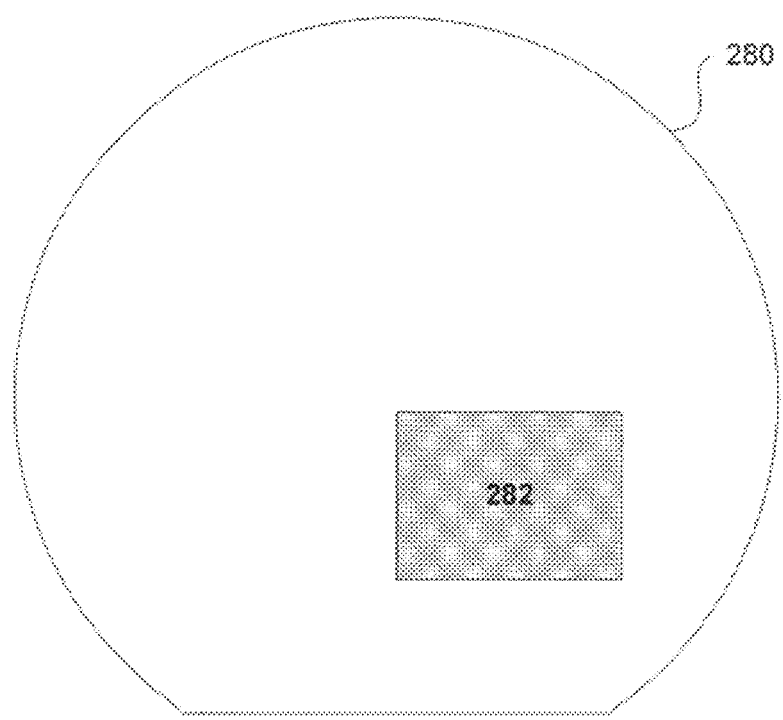
FIGS. 6A and 6B are diagrams of an exemplary image acquisition process.
Figure 6B:
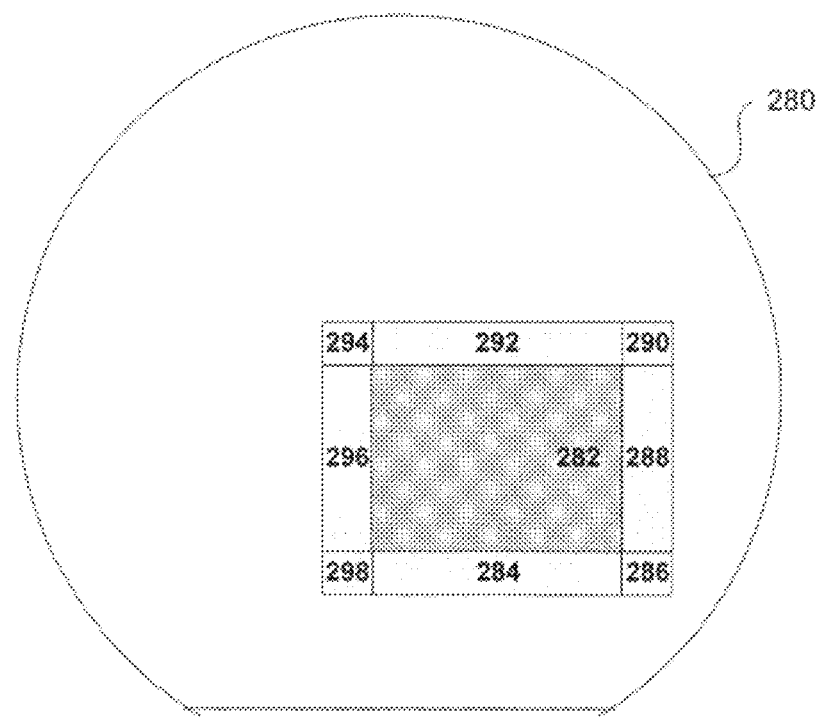

Referring to FIGS. 6A and 6B, FIGS. 6A and 6B, show an example of an image acquisition process in which the system 100 acquires images of portions of a sample surrounding a previously acquired image. FIG. 6A, shows a sample 280 for which an image of a portion 282 of the sample has been previously acquired and stored. In the absence of directional input (e.g., if the user does not provide any input and/or when the user is zooming and an out on a region of interest without panning the region of interest), the system 100 acquires and stores one or more images associated with portions of the sample adjacent to the portion 282 for which an image was previously acquired. For example, the system can acquire images of the sample in one or more of the surrounding regions 284, 286, 288, 290, 292, 294, 296, and 298 surrounding the previously acquired portion 282. While the regions are shown as edge regions (e.g., regions extending from an edge of the previously acquired image) and corner regions (e.g., regions contacting the original region only at a single corner), other image shapes could be used.

Figure 7A:
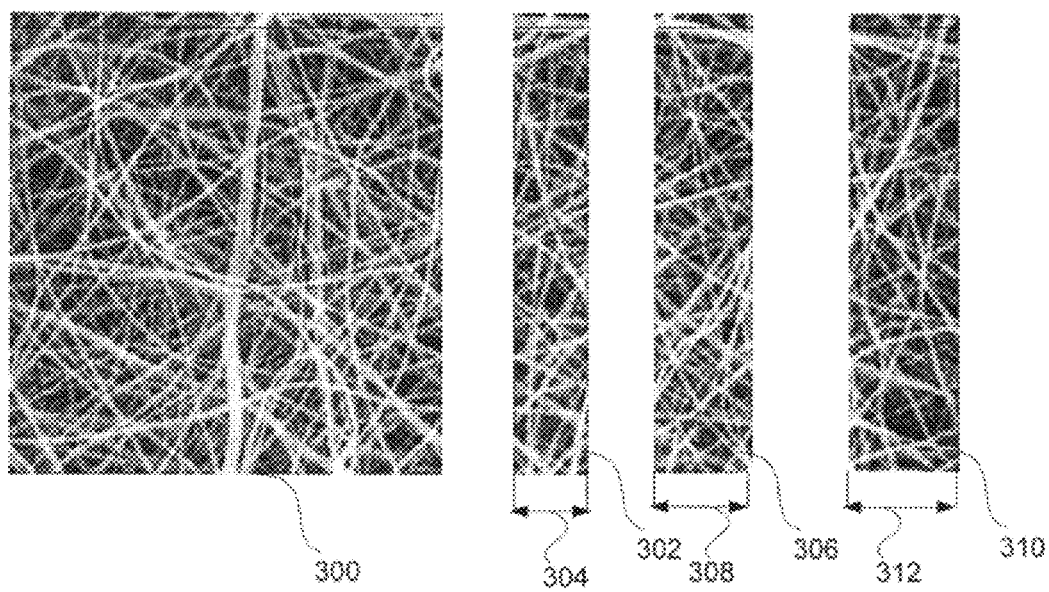
FIGS. 7A and 7B are diagrams of an exemplary image acquisition process.
Figure 7B:
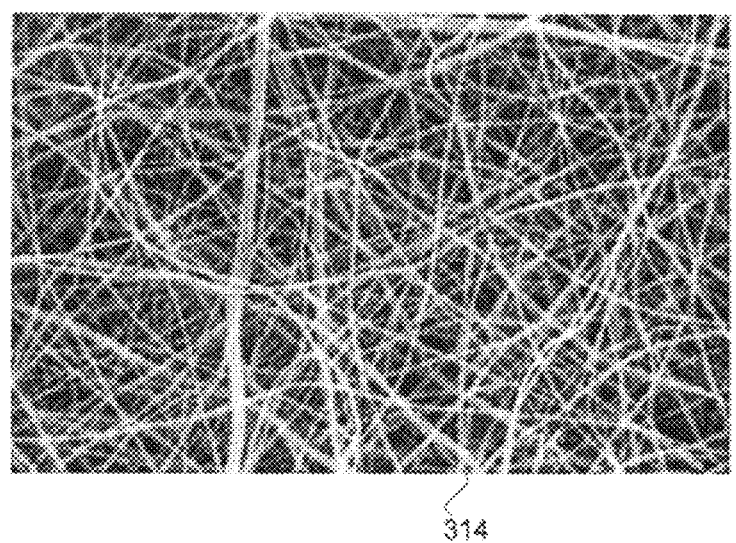

In some embodiments, as shown in FIGS. 7A and 7B, the size of the region for which an image is obtained to be joined with a prior image of an adjacent region can vary based on the speed of the user's movement. If the user is quickly panning across the image, an image of a smaller strip of the sample could be acquired so that the image could be available more rapidly whereas if the user is slowly moving, the system could acquire an image of a larger strip of the sample. As shown in FIG. 7A, the system 100 has acquired three images 302, 306, and 310 or regions to the right of image 300 on the sample. The widths 304, 308, and 312 of regions 302, 306, and 310, respectively, can differ. Regardless of the size of the regions for which system 100 acquires images, the acquired images are joined to generate an image 314 of a larger portion of the sample.

Global Navigation

While in the embodiments described above, a method for scanning portions of a sample and joining the images obtained at single level of magnification, in some embodiments scanning and image acquisition methods can include acquiring images at multiple levels of magnification. In some embodiments, the system 100 predicatively acquires an image at a higher level of magnification than the level of magnification of an image currently being viewed by a user based on the user's movement about the previously acquired image. In general, in order to reduce the total amount of areas of the sample for which higher magnification images are generated it can be desirable to allow a user to navigate on an image taken at a first level of magnification and acquire images of higher magnification levels in regions that are likely to be of interest to the user. Pre-acquiring the images at higher levels of magnifications can provide the advantage of having a higher magnification image available (e.g., stored in a memory) so it can be displayed rapidly as the user zooms into the region on an image acquired at a lower level of magnification.

Figure 8:
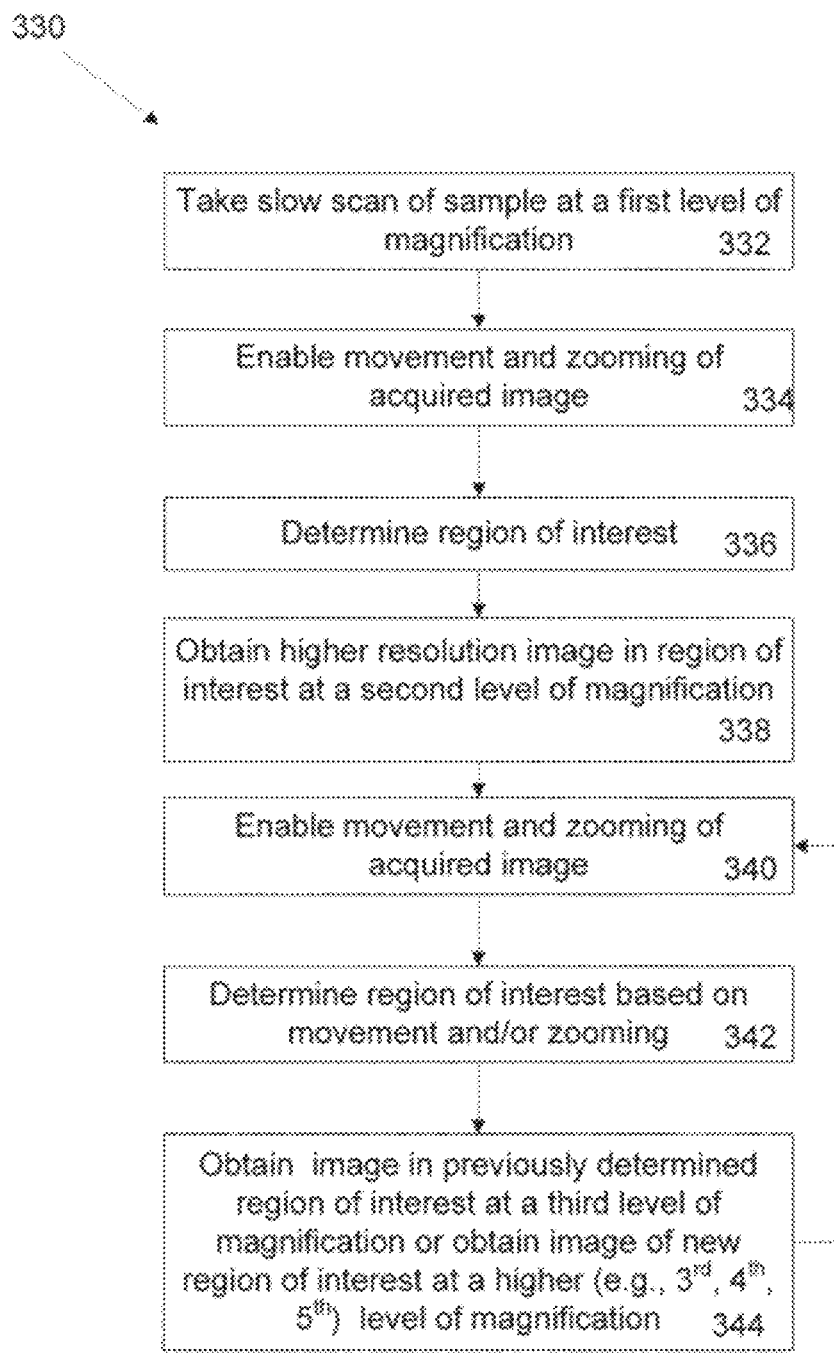
FIG. 8 is a flow chart of a navigation method for an image acquisition process.

Referring to FIG. 8, a process 330 for global navigation that includes panning a stored image and predicatively acquiring additional images at higher levels of magnification is shown. First, the system takes a low resolution, slow scan, picture of a sample and presents the high fidelity image to the user (332). The system enables the user to pan the stored image on the user interface (e.g., a computer screen) in the direction of interest (334). As the user pans the image, the stored picture moves on the screen as if a stage was moving. For example, the user can move the image on the screen using a mouse, a joystick, a touch screen, or another input device. The system partitions the image into multiple regions (e.g., halves, quadrants, sextants, a tiled array of regions, etc.) and determines a region of interest based on the user's movement of the image (336). For example, if the image is partitioned into quadrants, the system determines the direction of interest based on the user's movement of the image and selects one of the quadrants as the region of interest. The system obtains a slow scan image of the region identified as the region of interest (338). This image is at a higher level of magnification than the previously viewed image allowing the user to zoom in to a greater degree on the image without the image becoming pixilated. The system enables the user to pan the stored image on the user interface in the direction of interest (340). The higher level of magnification allows the operator to now zoom into a more detailed image. Similar to the partitioning described above, the system partitions the newly acquired image into multiple regions (e.g., halves, quadrants, sextants, a tiled array of regions, etc.) and determines a region of interest based on the user's movement of the image (342). The region of interest can be either a region which the user is likely to want to view a higher resolution (e.g., higher magnification) image of a particular portion of the sample or a region adjacent to the current region where the user is likely to desire to view an image of the same resolution as the currently viewed image but of a different portion of the sample. After the system determines the region of interest, the system obtains an image of the region of interest (344). For example, if the user zooms in on a particular location within the image, the region associated with the location at which the user is zooming is selected as the region of interest and the system scans the region at a higher level of magnification. On the other hand, if the user continues to pan the stored image and nears the edge of the image, the adjacent region at the same level of magnification as currently being viewed by the user can be selected as the region of interest and another image at the currently viewed level of magnification in a region adjacent to the first image is obtained. This process repeats as the operator moves and zooms to the desired location.

In the process described above, the operator will not see a live image of the stage moving on the screen. Rather, the operator views a previously acquired image.

The global navigation process described above in which the system determines whether to take a scan of a sub-region at a higher level of magnification or a scan of an adjacent region at the same level of magnification as an image currently being viewed is believed to provide various advantages. For example, since higher magnification images are obtained only in regions identified by the system to be of potential interest to the operator, the total amount of time spent scanning the sample is reduced.

Figure 9A:
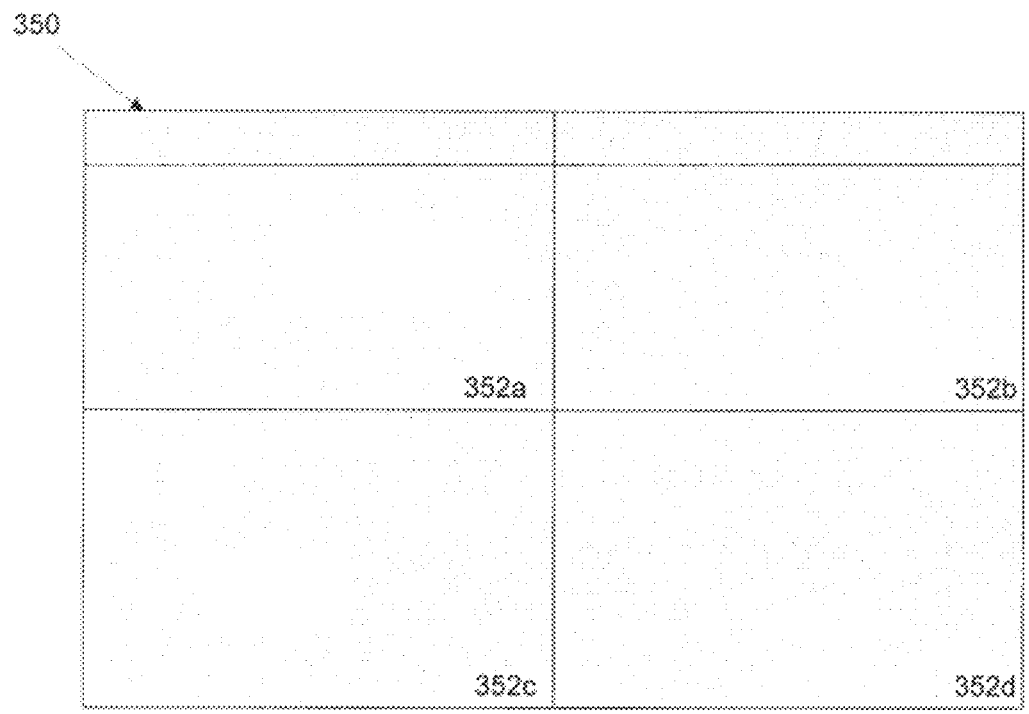
FIGS. 9A-9D are diagrams of an exemplary navigation and image acquisition process.
Figure 9B:
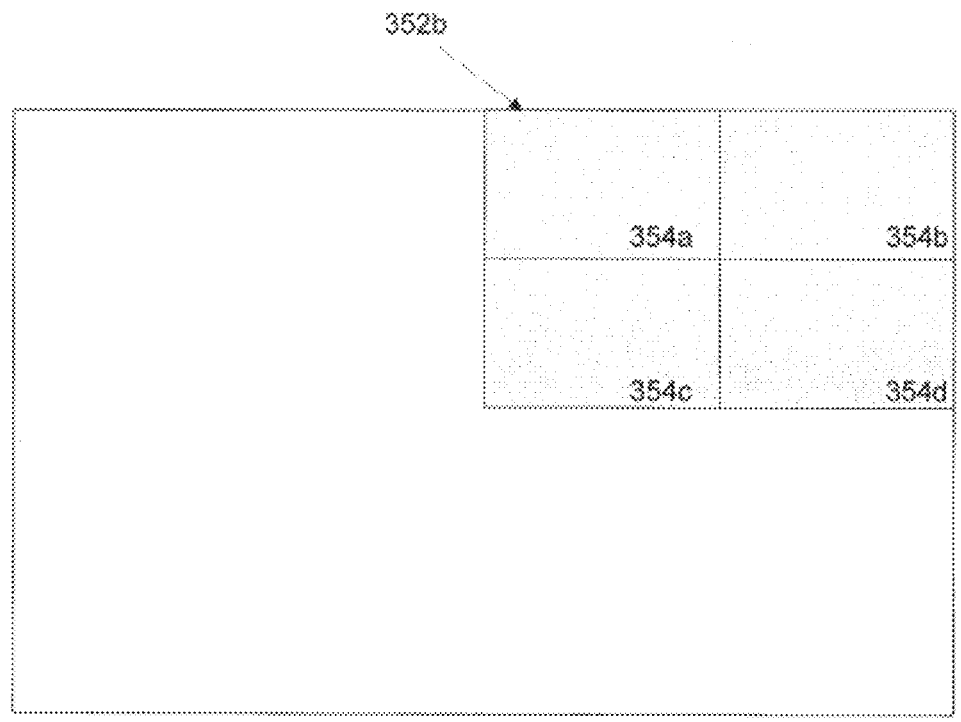
Figure 9C:
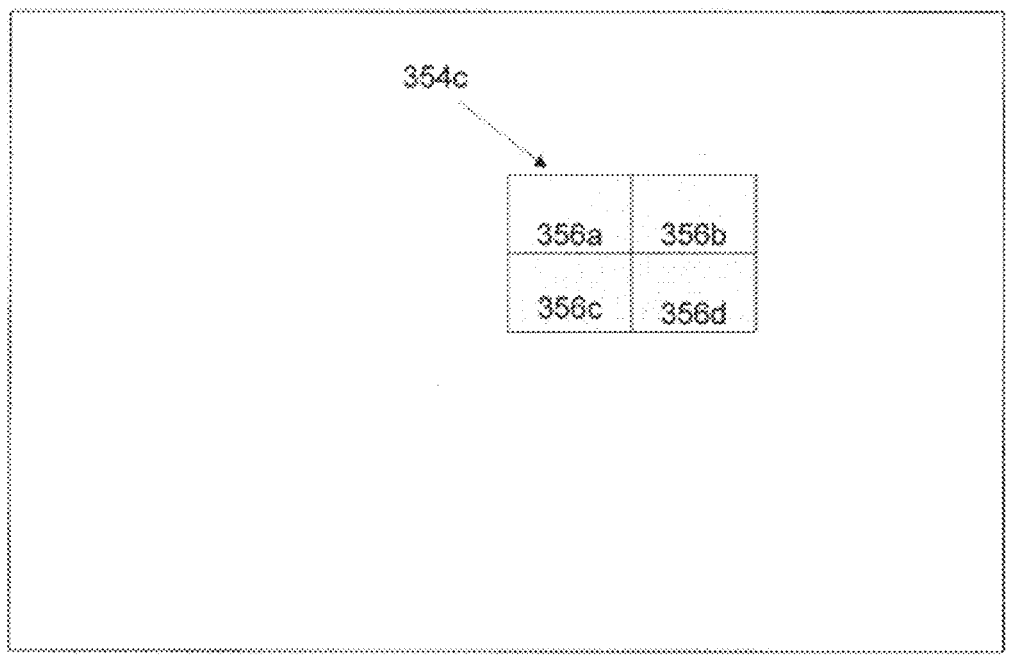
Figure 9D:
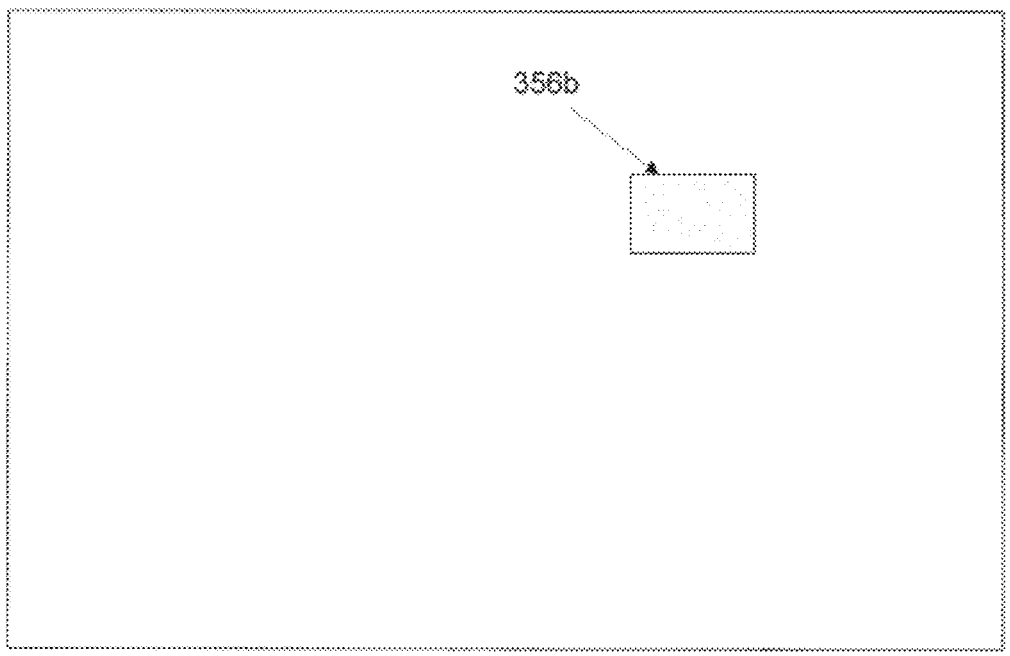

An example of the global navigation process 330 based on quadrants is described below in relation to FIGS. 9A-9D. FIG. 9A shows a region 350 of a sample for which a slow scan image at a low level of magnification has been obtained. The operator first views the slow scan of region 350. Via the joy stick or other input device, the operator moves the stored picture, not the stage to view various portions of the image. In this example, the image is divided into four quadrants 352a-352d and the system determines the direction of the operator's movement to select a region of interest. For example, if the operator moves the portion of the image displayed on the user interface into the X+, Y+ quadrant (e.g., quadrant 352b), quadrant 352b is selected as the region of interest. Based on this determined region of interest, the system automatically scans region 352b to obtain the image of the region at a higher level of magnification for later zoomed presentation (FIG. 9B). If the user zooms in on the image 350 to an extent where the higher magnification image is needed to provide a non-pixilated image on the user interface, then the system will switch from displaying a zoomed image of a portion of image 350 to displaying a portion of image 352b which was obtained at a higher level of magnification. This process of determining a region of interest and scanning the region of interest at a higher magnification is repeated until the desired level of magnification is obtained. More particularly, the operator views the slow scan of region 352b and moves the stored picture. The image 352b is divided into four quadrants 354a-354d and the operator moves the image into the X−, Y− quadrant (e.g., quadrant 354c). By moving the picture the system detects the desired direction of interest and automatically scans region 354c to obtain the image of the region at a higher level of magnification for later zoomed presentation (FIG. 9C). Again, if the user zooms in on a portion of the image of region 352b to a great enough extent, the system will switch from displaying the image of region 352b to displaying the higher magnification image of region 354c. The operator views the slow scan of region 354c and moves the stored picture. The image 354c is divided into four quadrants 356a-356d and the operator moves the image into the X+, Y+ quadrant (e.g., quadrant 356b). By moving the picture the system detects the desired direction of interest and automatically scans region 356b to obtain the image of the region at a higher level of magnification for later zoomed presentation (FIG. 9D). Due to the determination of the region of interest and scanning at higher levels of magnification based on the operator's movement of the stored images, only 4 pictures are taken to locate an area of interest and provide a high magnification image of the area and they are all low noise images with high fidelity. Unlike the raster based scanning described above in FIGS. 2A and 2B in which there is wasted rescanning, in this example each portion of the sample is scanned only a single time at any level of magnification.

Figure 10:
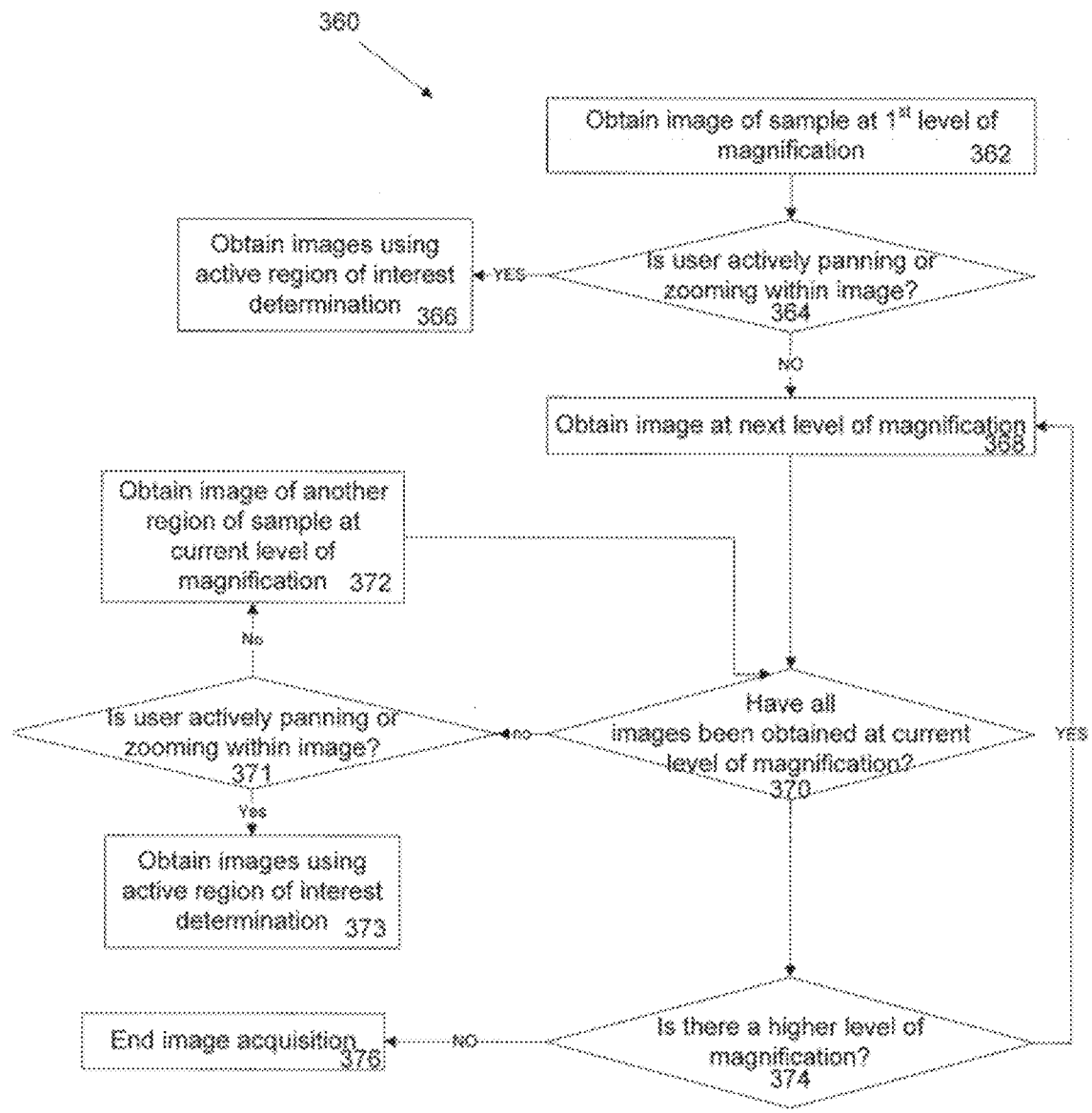
FIG. 10 is a flow chart of an image acquisition process.

While in the example described above, the system obtains a higher magnification image of a region of interest based on a user's movement of a previously acquired image, in some examples, the system can also obtain additional higher magnification images in the absence of operator input. FIG. 10 shows a flow chart of a process 360 for obtaining and storing images of a sample at various levels of magnification. The system obtains an image of a portion of the sample at a first level of magnification (362). The system determines whether the operator is actively panning or zooming within the image (364).

If the operator is actively panning or zooming, the system obtains additional images based on an active determination of a region of interest based on the movements of the operator (366) (e.g., using one or more of the methods described above). These images can be additional images at the same level of magnification, but at a different location on the sample or can be images of a portion of the sample at a higher level of magnification.

If the operator is not actively panning or zooming within the image (e.g., there is no input from the operator), the system obtains an image of a portion of the sample at a higher level of magnification (368). After the image has been obtained, the system determines if images for all portions of the sample have been obtained at that level of magnification (370). If not, the system again determines whether the operator is actively panning or zooming within the image (371). If the operator is actively panning or zooming within the image, the system collects additional images based on active determination of a region of interest based on the movements of the operator (373). If the operator is not actively panning or zooming within the image, the system obtains an image of another portion of the sample at the current level of magnification (372). The determination of whether all images have been obtained (370) and the collection of additional images at the level of magnification continues until either the operator actively moves or zooms within the stored images or all images have been collected for that level of magnification. When the system determines that all images have been obtained for a particular level of magnification, the system determines if there is a higher level of magnification for which images can be collected (374). If there is not a higher level of magnification, the system ends the image acquisition process (376). At this point, all images which a user could desire to view have been pre-obtained and stored in a memory. When the user views the images, the user will view only stored image information. If there is a higher level of magnification, the system returns to obtaining an image at the next level of magnification (368) and the process continues until all images have been collected.

User Identified Regions of Interest

While in some of the examples above, the system determined a region for which to obtain an additional image of the sample based on user movement of a stored image, in some embodiments, the user can select the regions of interest and the system can collect additional, higher magnification images based on the user's selected regions.

Figure 11:
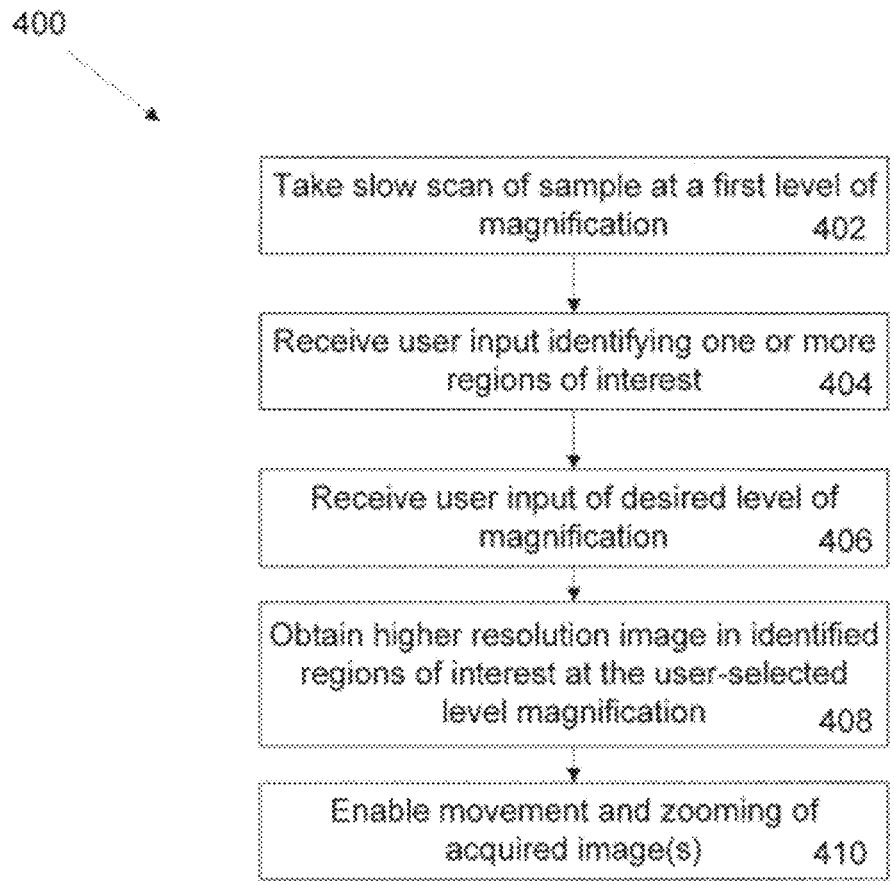
FIG. 11 is a flow chart of an image acquisition process based on user-inputted regions of interest.

Referring to FIG. 11, a process 400 for scanning portions of a sample and providing high resolution images of a portion of the sample based on an operator's identification of one or more regions of interest is shown. The system takes a slow scan of a sample at a first level of magnification (402). This level of magnification can be a level of magnification sufficient to allow the operator to view a substantial portion of the sample while providing a high enough level of resolution for the operator to identify regions of interest. The system receives from the operator an input identifying one or more regions of interest in the stored image (404). For example, the user can input the regions of interest by marking one or more regions in the image using a joystick, mouse, or touch screen. The system can optionally receive additional user input of desired level(s) of magnification at which images of the identified regions should be obtained (406). The system then obtains higher magnification images of the identified regions at the user-selected magnification levels (408). After acquisition of the images, the system enables the operator to move the images and zoom in and out of the obtained images (410).

Allowing the operator to identify regions of interest can provide various advantages. For example, if the user selects many regions of interest, the user can leave the system and perform other tasks while the time consuming process of obtaining higher magnification the images is performed. In contrast, in the prior art methods described above, since the operator views a real-time image as the system scans the sample, the user would have to wait while each image was obtained.

Display

Various methods for displaying the acquired images are possible. In some examples, the system displays an image and the user can actively pan or zoom within the image. If the user pans to a region of the sample for which an image has not yet been acquired, the system can place a space holder on the user interface (e.g., a blank region, a shaded region, and/or an image at a lower level of magnification) for the portions of the sample for which an image has not yet been obtained. As the system completes a slow scan of these regions, the image is added to the user interface for the operator to view.

Figure 12A:
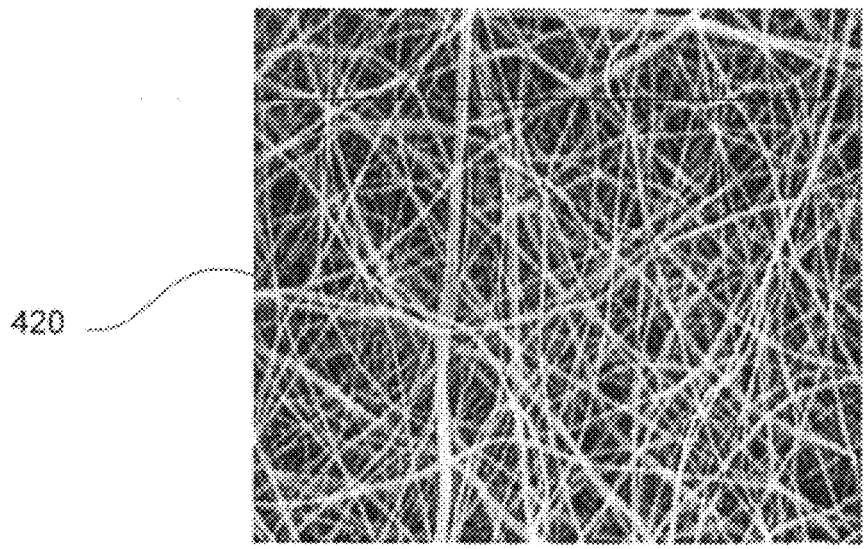
FIGS. 12A and 12B are diagrams of a user interface.
Figure 12B:
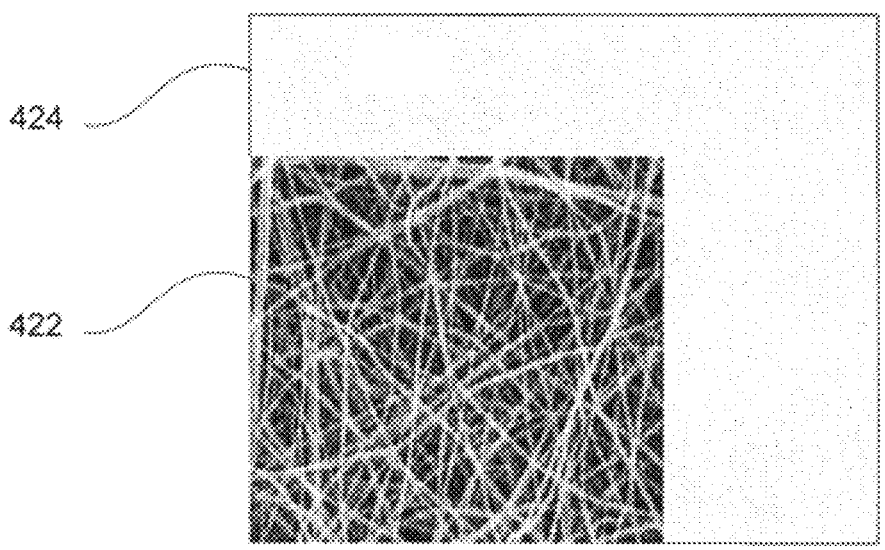

For example, FIG. 12A shows an image 420 of a portion of a sample. If the user moves the image to view a portion of the sample above and to the right of the image 420, the system can display a blank space 424 on the user interface while an image of the additional region is produced. If the image has been previously obtained, the system retrieves the stored image and fills the blank space 424 with the stored image. If the image for the region associated with the blank space 424 has not been previously acquired, the system can complete a slow scan of the region associated with the blank space 424 (and not the region 422 for which image data had been previously acquired) and display the newly completed scan to the user with the previously acquired images.

As described above, in some embodiments, if the image has been previously obtained, the system retrieves the stored image and fills the blank space with the stored image. In some embodiments, an image of the region may have been previously obtained, but at a different resolution. If the previously imaged portion was imaged at a different resolution, the image data from the image can be agglomerated (if the image was previously exposed with a higher resolution) or interpolated (if the image was previously exposed with a lower resolution).

For example, if operator chooses a desired region to image by specifying the center of the image (e.g. 1.3256 cm on the x axis, and 2.1928 cm on the y axis), a field of view of 30 microns×30 microns, and an image resolution of 1024 pixels×1024 pixels, each pixel would be 30 nm×30 nm in size. If, the computer system determines that a portion of that region has already been exposed, but with a higher resolution—say a pixel size of 15 nm×15 nm. The higher resolution image data is then 'agglomerated' such that 4 of the higher resolution pixels are combined to produce a single pixel of the desired resolution. In another example, if the computer system determines that a portion of that region has already been exposed, but with a lower resolution, e.g., a pixel size of 100 nm×100 nm. The lower resolution data is them interpolated so that the image data at intermediate values is estimated from the previously obtained low resolution image data.

In some embodiments, the system can limit the speed at which the user can move the image such that the system will have time to acquire images in regions of the sample adjacent to the previously acquired images prior to the user moving the image to an extent where the system needs to display such portions. By limiting the speed of movement, in some embodiments, the operator will always be viewing an image and will not see the blank space described above.

Computer Systems and Processors

While in the embodiments described above, the scanning methods were described as being used to obtain images using an ion microscope, similar methods can be used with other types of microscope systems. For example, the methods described herein can be used with scanning electron microscope (SEM) systems, scanning transmission electron microscope (STEM) systems, scanning probe microscopy (SPM) systems, laser scanning microscope (LSM) systems, etc.

The processors and computer systems associated with the microscope systems and scanning methods described herein can be implemented in digital electronic circuitry, or in computer hardware, firmware, software, web-enabled applications, or in combinations thereof. Data structures used to represent information (e.g., obtained images, user inputs) can be stored in memory and in persistence storage. Apparatus of the invention can be implemented in a computer program product tangibly embodied in a machine-readable storage device for execution by a programmable processor and method actions can be performed by a programmable processor executing a program of instructions to perform functions of the invention by operating on input data and generating output. The scanning methods can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired, and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files, such devices include magnetic disks, such as internal hard disks and removable disks magneto-optical disks and optical disks. Storage devices suitable for tangibly embodying computer program instructions and data include all forms of non-volatile memory, including, by way of example, semiconductor memory devices, such as EPROM, EEPROM, and flash memory devices; magnetic disks such as, internal hard disks and removable disks; magneto-optical disks; and CD-ROM disks. Any of the foregoing can be supplemented by, or incorporated in, ASICs (application-specific integrated circuits).

Ion Microscopes

This section discloses systems and methods for producing ion beams, and detecting particles including secondary electrons that leave a sample of interest due to exposure of the sample to an ion beam. The systems and methods can be used to obtain one or more images of the sample, for example, using one or more of the scanning techniques disclosed herein.

Typically, such ion beams are produced in multipurpose microscope systems. Microscope systems that use a gas field ion source to generate ions that can be used in sample analysis (e.g., imaging) are referred to as gas field ion microscopes. A gas field ion source is a device that includes an electrically conductive tip (typically having an apex with 10 or fewer atoms) that can be used to ionize neutral gas species to generate ions (e.g., in the form of an ion beam) by bringing the neutral gas species into the vicinity of the electrically conductive tip (e.g., within a distance of about four to five angstroms) while applying a high positive potential (e.g., one kV or more relative to the extractor (see discussion below)) to the apex of the electrically conductive tip. Optionally, a coating as described herein can be present on the tip.

Figure 13:
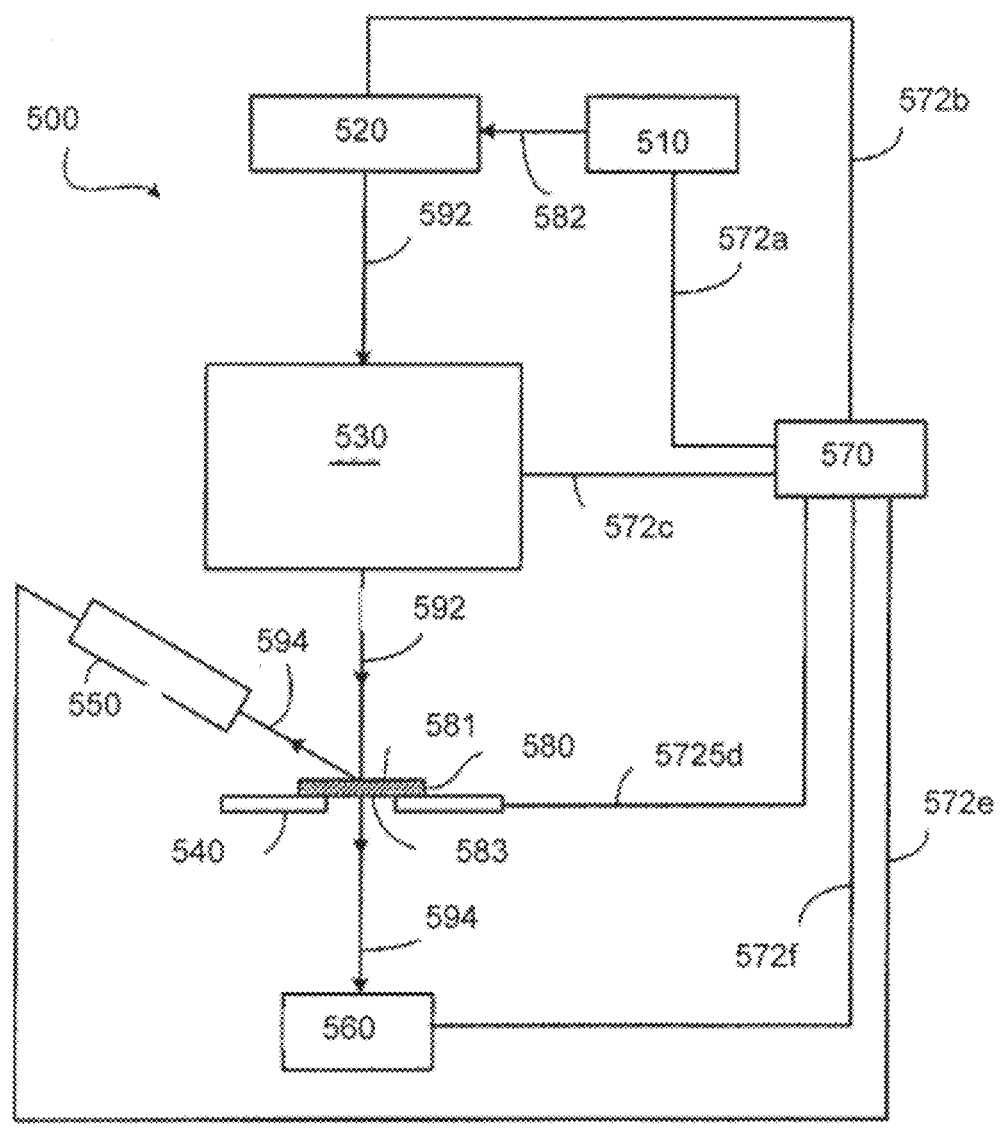
FIGS. 13 and 14 are diagrams of an exemplary ion microscope.

FIG. 13 shows a schematic diagram of a gas field ion microscope system 500 that includes a gas source 510, a gas field ion source 520, ion optics 530, a sample manipulator 540, a front-side detector 550, a back-side detector 560, and an electronic control system 570 (e.g., an electronic processor, such as a computer) electrically connected to various components of system 500 via communication lines 572a-572f. A sample 580 is positioned in/on sample manipulator 540 between ion optics 530 and detectors 550, 560. During use, an ion beam 592 is directed through ion optics 530 to a surface 581 of sample 580, and particles 594 resulting from the interaction of ion beam 592 with sample 580 are measured by detectors 550 and/or 560.

In general, it is desirable to reduce the presence of certain undesirable chemical species in system 500 by evacuating the system. Typically, different components of system 500 are maintained at different background pressures. For example, gas field ion source 520 can be maintained at a pressure of approximately 10-10 Torr. When gas is introduced into gas field ion source 520, the background pressure rises to approximately 10-5 Torr. Ion optics 530 are maintained at a background pressure of approximately 10-8 Torr prior to the introduction of gas into gas field ion source 520. When gas is introduced, the background pressure in ion optics 530 typically increase to approximately 10-7 Torr. Sample 580 is positioned within a chamber that is typically maintained at a background pressure of approximately 10-6 Torr. This pressure does not vary significantly due to the presence or absence of gas in gas field ion source 520.

Figure 14:
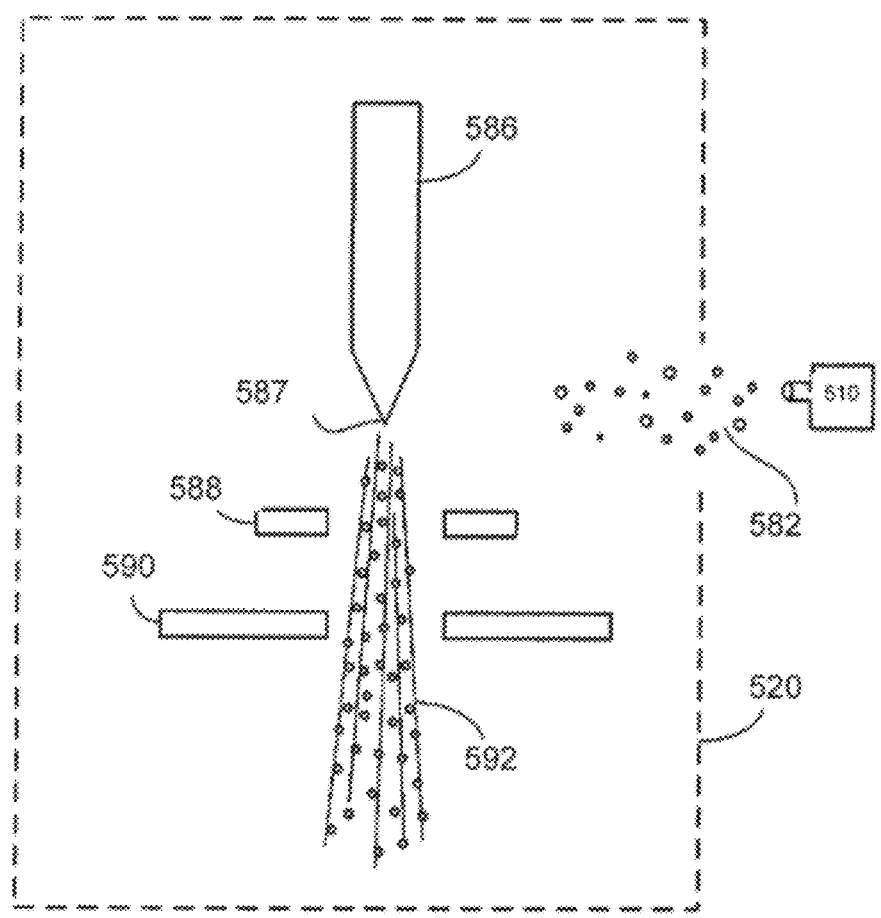

As shown in FIG. 14, gas source 510 is configured to supply one or more gases 582 to gas field ion source 520. Generally, gas source 510 can be configured to supply the gas(es) at a variety of purities, flow rates, pressures, and temperatures. In general, at least one of the gases supplied by gas source 510 is a noble gas (helium (He), neon (Ne), argon (Ar), krypton (Kr), xenon (Xe)), and ions of the noble gas are desirably the primary constituent in ion beam 592. In general, as measured at surface 581 of sample 580, the current of ions in ion beam 592 increases monotonically as the pressure of the noble gas in system 500 increases. In certain embodiments, this relationship can be described by a power law where, for a certain range of noble gas pressures, the current increases generally in proportion to gas pressure. During operation, the pressure of the noble gas is typically 10-2 Torr or less (e.g., 10-3 Torr or less, 10-4 Torr or less), and/or 10-7 Torr or more (e.g., 10-6 Torr or more, 10-5 Torr or more) adjacent the tip apex (see discussion below). In general, it is desirable to use relatively high purity gases (e.g., to reduce the presence of undesirable chemical species in the system).

Optionally, gas source 510 can supply one or more gases in addition to the noble gas(es). As discussed in more detail below, an example of such a gas is nitrogen. Typically, while the additional gas(es) can be present at levels above the level of impurities in the noble gas(es), the additional gas(es) still constitute minority components of the overall gas mixture introduced by gas source 510. As an example, in embodiments in which He gas and Ne gas are introduced by gas source 510 into gas field ion source 520, the overall gas mixture can include 20% or less (e.g., 15% or less, 12% or less) Ne, and/or 1% or more (e.g., 3% or more, 8% or more) Ne. For example, in embodiments in which He gas and Ne gas are introduced by gas source 510, the overall gas mixture can include from 5% to 15% (e.g., from 8% to 12%, from 9% to 11%) Ne. As another example, in embodiments in which He gas and nitrogen gas are introduced by gas source 510, the overall gas mixture can include 1% or less (e.g., 0.5% or less, 0.1% or less) nitrogen, and/or 0.01% or more (e.g., 0.05% or more) nitrogen. For example, in embodiments in which He gas and nitrogen gas are introduced by gas source 510, the overall gas mixture can include from 0.01% to 1% (e.g., from 0.05% to 0.5%, from 0.08 to 0.12%) nitrogen. In some embodiments, the additional gas(es) are mixed with the noble gas(es) before entering system 500 (e.g., via the use of a gas manifold that mixes the gases and then delivers the mixture into system 500 through a single inlet). In certain embodiments, the additional gas(es) are not mixed with the noble gas(es) before entering system 500 (e.g., a separate inlet is used for inputting each gas into system 500, but the separate inlets are sufficiently close that the gases become mixed before interacting with any of the elements in gas field ion source 520).

Gas field ion source 520 is configured to receive the one or more gases 582 from gas source 510 and to produce gas ions from gas(es) 582. Gas field ion source 520 includes an electrically conductive article 586 with a tip apex 587, an extractor 590 and optionally a suppressor 588. Electrically conductive article 586 is generally configured as described above.

During use, article 586 is biased positively (e.g., approximately 20 kV) with respect to extractor 590, extractor 590 is negatively or positively biased (e.g., from −20 kV to +50 kV) with respect to an external ground, and optional suppressor 588 is biased positively or negatively (e.g., from −5 kV to +5 kV) with respect to article 586. Because article 586 is formed of an electrically conductive material, the electric field of article 586 at apex 587 points outward from the surface of tip apex 587. Due to the shape of article 586, the electric field is strongest in the vicinity of tip apex 587. The strength of the electric field of article 586 can be adjusted, for example, by changing the positive voltage applied to article 586. With this configuration, un-ionized gas atoms 582 supplied by gas source 510 are ionized and become positively-charged ions in the vicinity of apex 587. The positively-charged ions are simultaneously repelled by positively charged article 586 and attracted by negatively charged extractor 590 such that the positively-charged ions are directed from article 586 into ion optics 530 as ion beam 592. Suppressor 588 assists in controlling the overall electric field between article 586 and extractor 590 and, therefore, the trajectories of the positively-charged ions from article 586 to ion optics 530. In general, the overall electric field between article 586 and extractor 590 can be adjusted to control the rate at which positively-charged ions are produced at apex 587, and the efficiency with which the positively-charged ions are transported from article 586 to ion optics 530.

As an example, without wishing to be bound by theory, it is believed that He ions can be produced as follows. Gas field ion source 520 is configured so that the electric field of article 586 in the vicinity of apex 587 exceeds the ionization field of the un-ionized He gas atoms 582, and article 586 is maintained at a relatively low temperature. When the un-ionized He gas atoms 582 are in close proximity to apex 587, the He atoms can be polarized by the electric field of the tip, producing a weakly attractive force between He atoms 582 and apex 587. As a result, He atoms 582 may contact tip apex 587 and remain bound (e.g., physisorbed) thereto for some time. In the vicinity of apex 187, the electric field is high enough to ionize He atoms 582 adsorbed onto apex 587, generating positively charged He ions (e.g., in the form of an ion beam).

In general, ion optics 530 are configured to direct ion beam 592 onto surface 581 of sample 580. Ion optics 530 can, for example, focus, collimate, deflect, accelerate, and/or decelerate ions in beam 592. Ion optics 530 can also allow only a portion of the ions in ion beam 592 to pass through ion optics 530. Generally, ion optics 530 include a variety of electrostatic and other ion optical elements that are configured as desired. By manipulating the electric field strengths of one or more components (e.g., electrostatic deflectors) in ion optics 530, He ion beam 592 can be scanned across surface 581 of sample 580. For example, ion optics 530 can include two deflectors that deflect ion beam 592 in two orthogonal directions. The deflectors can have varying electric field strengths such that ion beam 592 is rastered across a region of surface 581.

When ion beam 592 impinges on sample 580, a variety of different types of particles 594 can be produced. These particles include, for example, secondary electrons, Auger electrons, secondary ions, secondary neutral particles, primary neutral particles, scattered ions and photons (e.g., X-ray photons, IR photons, visible photons, UV photons). Detectors 550 and 560 are positioned and configured to each measure one or more different types of particles resulting from the interaction between He ion beam 592 and sample 580. As shown in FIG. 13, detector 550 is positioned to detect particles 594 that originate primarily from surface 581 of sample 580, and detector 560 is positioned to detect particles 594 that emerge primarily from surface 583 of sample 580 (e.g., transmitted particles). As described in more detail below, in general, any number and configuration of detectors can be used in the microscope systems disclosed herein. In some embodiments, multiple detectors are used, and some of the multiple detectors are configured to measure different types of particles. In certain embodiments, the detectors are configured to provide different information about the same type of particle (e.g., energy of a particle, angular distribution of a given particle, total abundance of a given particle). Optionally, combinations of such detector arrangements can be used.

In general, the information measured by the detectors is used to determine information about sample 580. Typically, this information is determined by obtaining one or more images of sample 580. By rastering ion beam 592 across surface 581, pixel-by-pixel information about sample 580 can be obtained in discrete steps.

The operation of microscope system 500 is typically controlled via electronic control system 570. For example, electronic control system 570 can be configured to control the gas(es) supplied by gas source 510, the temperature of article 586, the electrical potential of article 586, the electrical potential of extractor 590, the electrical potential of suppressor 588, the settings of the components of ion optics 530, the position of sample manipulator 540, and/or the location and settings of detectors 550 and 560. Optionally, one or more of these parameters may be manually controlled (e.g., via a user interface integral with electronic control system 570). Additionally or alternatively, electronic control system 570 can be used (e.g., via an electronic processor, such as a computer) to analyze the information collected by detectors 550 and 560 and to provide information about sample 580 (e.g., topography information, material constituent information, crystalline information, voltage contrast information, optical property information, magnetic information), which can optionally be in the form of an image, a graph, a table, a spreadsheet, or the like. Typically, electronic control system 570 includes a user interface that features a display or other kind of output device, an input device, and a storage medium.

Electronic control system 570 can also be configured to implement the pulse counting techniques disclosed herein. For example, electronic control system 570 can be configured to set a threshold level (e.g., in detector 550 and/or 560 in the form of a comparator setting or another hardware device setting, or as a software filter in the electronic control system). Electronic control system 570 can also be configured to count pulses in signals measured by detectors 550 and/or 560, and to determine pixel intensity values based on the counted pulses.

In some embodiments, system 500 can be used in semiconductor fabrication to determine information about the surface and/or subsurface region of a sample during semiconductor article manufacture or at the end of semiconductor article manufacture, and/or to cause chemistry (e.g., ion beam induced chemistry, such as ion beam induced deposition) to occur during manufacture of a semiconductor article. Examples of such uses include maskless lithography, gas assisted chemistry, sputtering, detection of voids, overlay shift registration, critical dimension metrology, line edge roughness, line edge thickness, circuit editing, mask repair, defect inspection, defect review, and/or circuit testing. In certain embodiments, system 500 is used to identify and examine metal corrosion in various devices and material. In some embodiments, system 500 is used to detect defects in read/write heads used in magnetic storage devices such as hard disks. In certain embodiments, system 500 is used to determine elemental and/or chemical compositional information about a biological sample (e.g., in a non-destructive manner). In some embodiments, system 500 is used to determine crystallographic information about a therapeutic agent (e.g., small molecule drug).

Other embodiments are in the following claims.

What is claimed is:

1. A method comprising:
   exposing a first portion of a sample to a charged particle beam to generate a first image of the first portion of the sample;
   receiving, at a control system, a directional input;
   determining if a second portion of the sample adjacent to the first portion of the sample in a direction based on the directional input has been previously exposed to generate an image of the second portion;
   if the second portion has been previously exposed, retrieving the image of the second portion from a memory; and
   if the second portion has not been previously exposed, exposing a second portion of the sample adjacent to the first portion of the sample in a direction based on the directional input to a charged particle beam to generate a second image;
   combining at least a portion of the first image with the second image or the retrieved image of the second portion to generate a third image; and
   displaying the third image on a user interface.

2. The method of claim 1, wherein:
   exposing the first portion of the sample to the charged particle beam to generate the first image comprises using a slow scan technique; and
   exposing the second portion of the sample to the charged particle beam to generate the second image comprises using a slow scan technique.

3. The method of claim 1, wherein the second image comprises a fewer number of pixels than the first image.

4. The method of claim 1, wherein the second portion of the sample comprises a smaller area of the sample than the first portion of the sample.

5. The method of claim 1, wherein the directional input comprises an indication of a direction of movement and an indication of a speed of movement.

6. The method of claim 5, further comprising:
   determining a size of the second portion of the sample to expose to the particle beam based on the indication of the speed of movement; and
   determining a location of the second portion of the sample to expose to the particle beam based on the direction of movement.

7. The method of claim 1, wherein combining at least a portion of the first and second images to generate the third image comprises combining a subsection of less than the entire first image with at least a portion of the second image.

8. The method of claim 1, wherein receiving the directional input comprises:
   displaying the first image on a user interface;
   moving, in response to a user input, the first image on the user interface.

9. The method of claim 1, wherein moving the first image on the user interface comprises moving the first image without moving the sample.

10. The method of claim 1, wherein exposing a second portion of the sample adjacent to the first portion of the sample in a direction based on the directional input comprises:
    exposing the second portion to generate a low resolution image; and
    subsequently exposing the second portion to generate a high resolution image.

11. The method of claim 1, wherein if the second portion has been previously exposed, the method further comprises determining a resolution of the retrieved image of the second portion.

12. The method of claim 11, wherein combining at least a portion of the first image with the retrieved image of the second portion to generate the third image comprises agglomerating image data from the retrieved image of the second portion to match a resolution of the first image.

13. The method of claim 11, wherein combining at least a portion of the first image with the retrieved image of the second portion to generate the third image comprises interpolating image date from the retrieved image of the second portion to match a resolution of the first image.

14. The method of claim 1, further comprising:
displaying, on a user interface associated with a particle beam system, the first image; and
displaying, on the user interface, the second image, the second portion of the sample including a non-overlapping region not included in the first portion and an overlapping region included in the first portion, the second image comprising an image generated by exposing the non-overlapping region of the sample to a charged particle beam without exposing the overlapping region to the charged particle beam.

15. The method of claim 14, wherein the particle beam system comprises an ion microscope.

16. The method of claim 1, wherein the first image is a slow scan image, and the method further comprises:
displaying the slow scan image at a first magnification on a user interface;
receiving an input indicating the second portion of the sample is desired to be viewed at a second level of magnification that is different than the first level of magnification;
determining if the second portion has been previously exposed to generate an image of the second portion at the second level of magnification;
if the second portion has been previously exposed at the second level of magnification, retrieving the image of the second portion from a memory; and
if the second portion has not been previously exposed at the second level of magnification, scanning the second portion of the sample at the second magnification using a slow scan technique, displaying the slow scan image of the second portion of the sample on the user interface.

17. The method of claim 16, wherein the input comprises an input from a user.

18. The method of claim 16, wherein the input comprises an input of an instruction program.

19. The method of claim 16, wherein the second portion comprises a subsection of the first portion and the second magnification is a higher level of magnification than the first level of magnification.

20. The method of claim 1, further comprising:
receiving an identification of one or more regions of interest in the first image; and
exposing the identified regions of interest to the charged particle beam to generate a images of the regions of interest at a second level of magnification, the second level of magnification being greater than the first level of magnification.

21. The method of claim 20, wherein receiving an identification of one or more regions of interest comprises receiving the identification of the one or more regions of interest from a user.

22. The method of claim 20, wherein receiving an identification of one or more regions of interest comprises receiving the identification of the one or more regions of interest from an instruction program.

23. A method comprising:
exposing a sample to a charged particle beam to generate a first image of a first portion of the sample;
exposing portions of the sample adjacent to the first portion of the sample in multiple directions to a charged particle beam to generate a set of adjacent images;
receiving, at a control system, a directional input;
based on the directional input, selecting one or more of the adjacent images;
combining at least a portion of the first image with at least a portion of one or more of the selected adjacent images to generate a third image; and
displaying the third image on a user interface.

* * * * *